(12) United States Patent
Sakata et al.

(10) Patent No.: US 9,431,345 B2
(45) Date of Patent: Aug. 30, 2016

(54) SEMICONDUCTOR DEVICE AND METHOD OF MANUFACTURING THE SAME

(71) Applicant: KABUSHIKI KAISHA TOSHIBA, Minato-ku, Tokyo (JP)

(72) Inventors: Atsuko Sakata, Yokkaichi (JP); Masayuki Kitamura, Yokkaichi (JP); Makoto Wada, Yokohama (JP); Masayuki Katagiri, Kawasaki (JP); Yuichi Yamazaki, Inagi (JP); Akihiro Kajita, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 113 days.

(21) Appl. No.: 14/022,505

(22) Filed: Sep. 10, 2013

(65) Prior Publication Data

US 2014/0284802 A1    Sep. 25, 2014

(30) Foreign Application Priority Data

Mar. 25, 2013 (JP) .................................. 2013-062590

(51) Int. Cl.
| | |
|---|---|
| *H01L 23/48* | (2006.01) |
| *H01L 23/52* | (2006.01) |
| *H01L 29/40* | (2006.01) |
| *H01L 23/532* | (2006.01) |
| *H01L 21/768* | (2006.01) |
| *H01L 23/528* | (2006.01) |

(52) U.S. Cl.
CPC ..... *H01L 23/53276* (2013.01); *H01L 21/7685* (2013.01); *H01L 21/76805* (2013.01); *H01L 21/76849* (2013.01); *H01L 21/76852* (2013.01); *H01L 23/53238* (2013.01); *H01L 23/53257* (2013.01); *H01L 23/5283* (2013.01); *H01L 2924/0002* (2013.01)

(58) Field of Classification Search
CPC ..................... H01L 29/1606; H01L 23/53276; H01L 23/5226; H01L 23/53252; H01L 23/53228; H01L 23/53257
USPC ................................................. 257/750, 762
See application file for complete search history.

(56) References Cited

U.S. PATENT DOCUMENTS

| | | | | |
|---|---|---|---|---|
| 5,162,261 A | * | 11/1992 | Fuller | ............... H01L 21/76804 257/E21.578 |
| 6,136,624 A | * | 10/2000 | Kemmochi | ....... G02F 1/136227 257/E21.259 |
| 2009/0136412 A1 | | 5/2009 | Awano et al. | |
| 2011/0006425 A1 | | 1/2011 | Wada et al. | |

(Continued)

FOREIGN PATENT DOCUMENTS

| | | |
|---|---|---|
| JP | 2000-191302 | 7/2000 |
| JP | 2009-70911 | 4/2009 |
| JP | 2010-62333 | 3/2010 |

(Continued)

OTHER PUBLICATIONS

First Office Action issued by the Japanese Patent Office on Jun. 30, 2015, for Japanese Patent Application No. 2013-062590, and English-language translation thereof.

*Primary Examiner* — Thien F Tran
(74) *Attorney, Agent, or Firm* — Finnegan, Henderson, Farabow, Garrett & Dunner, LLP

(57) ABSTRACT

According to one embodiment, a semiconductor device includes a metal interconnect and a graphene interconnect which are stacked to one another.

5 Claims, 9 Drawing Sheets

(56) References Cited

U.S. PATENT DOCUMENTS

2011/0101528 A1* 5/2011 Akimoto ........... H01L 21/76802
257/751
2012/0080661 A1* 4/2012 Saito et al. ..................... 257/29

FOREIGN PATENT DOCUMENTS

| JP | 2012-74682 | 4/2012 |
| JP | 2012-80006 | 4/2012 |

* cited by examiner

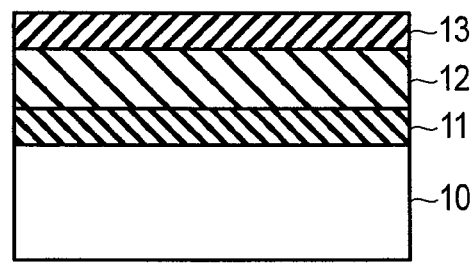
F I G. 1
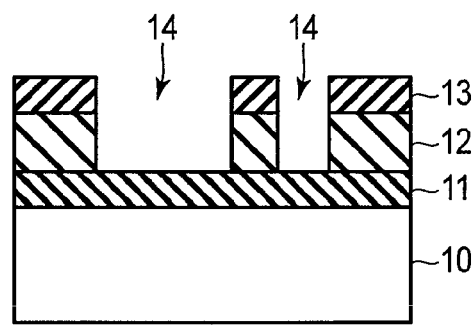
F I G. 2
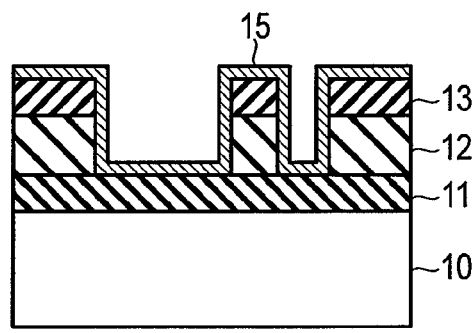
F I G. 3

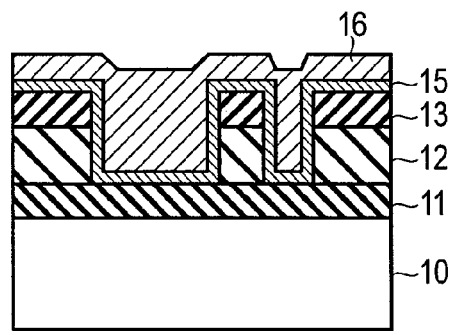
F I G. 4
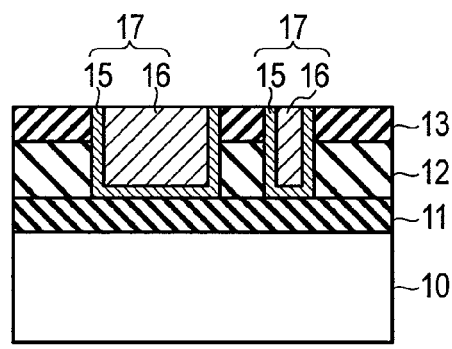
F I G. 5
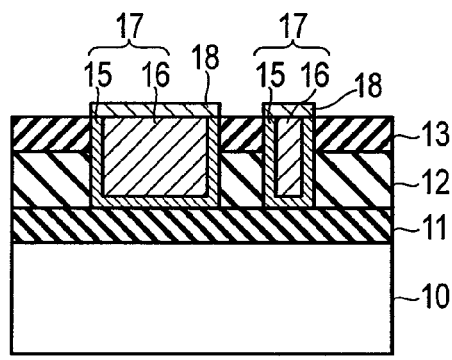
F I G. 6

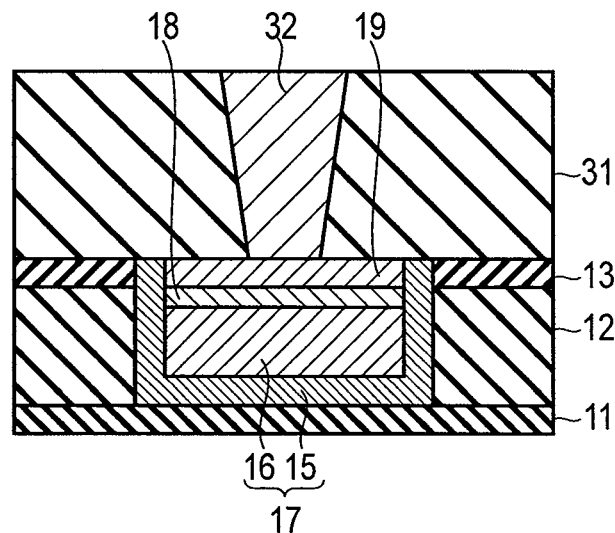
F I G. 11
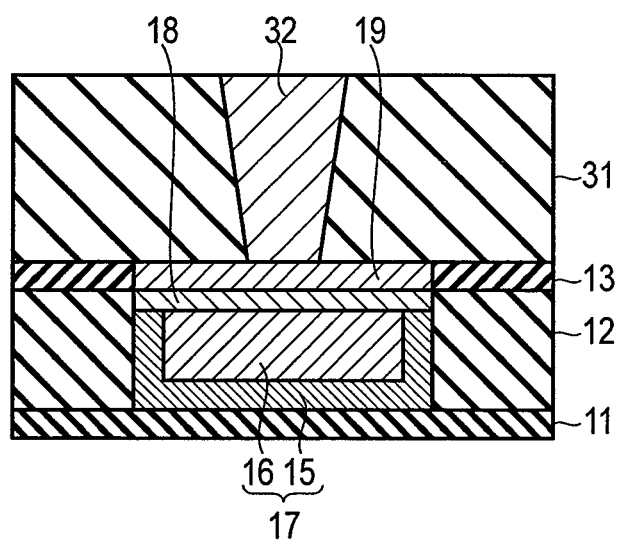
F I G. 12

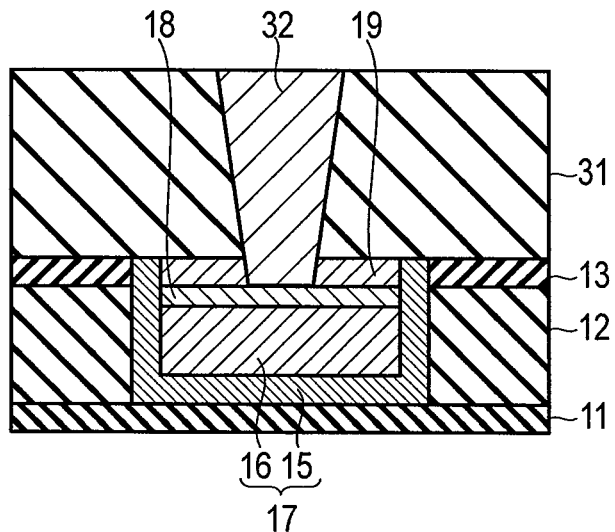
F I G. 11A
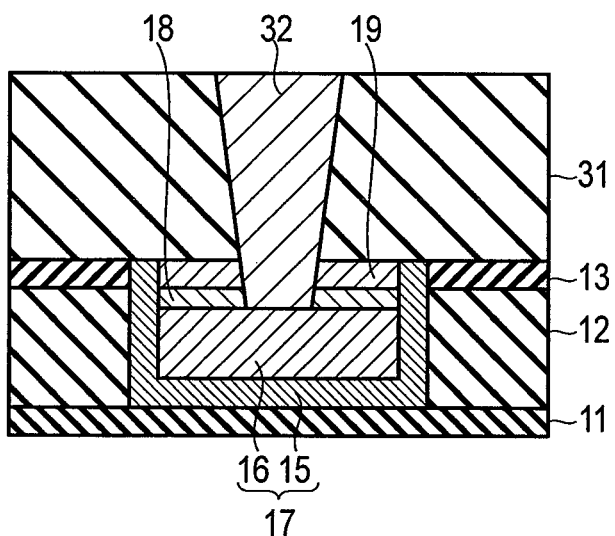
F I G. 11B

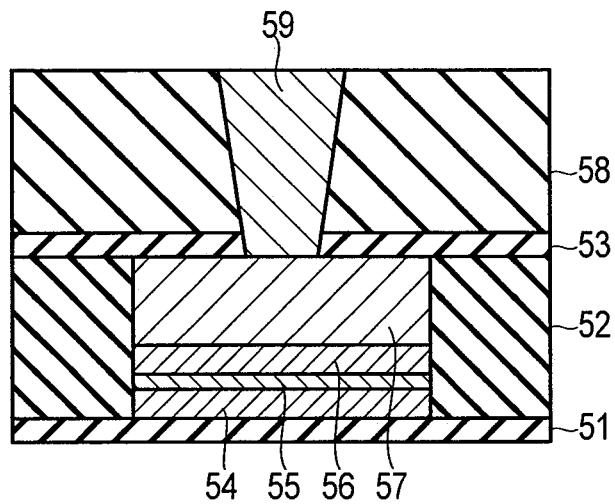
F I G. 15
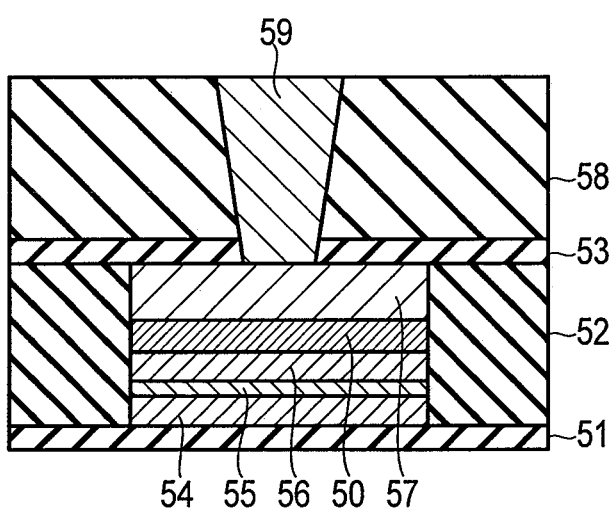
F I G. 16

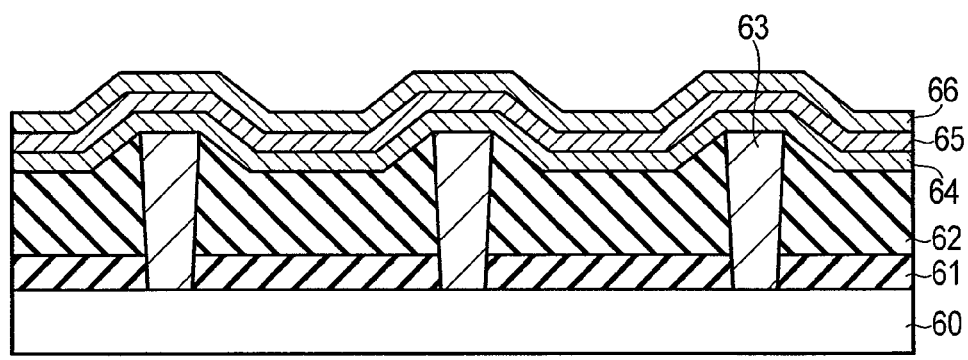
F I G. 17
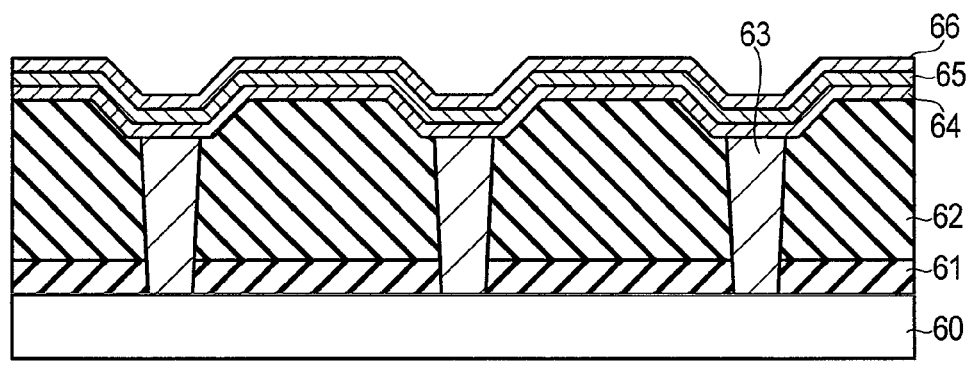
F I G. 18
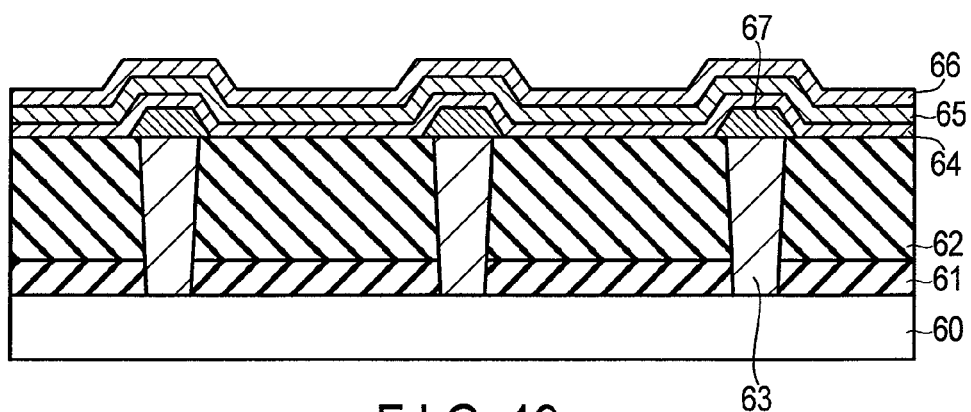
F I G. 19

SEMICONDUCTOR DEVICE AND METHOD OF MANUFACTURING THE SAME

CROSS-REFERENCE TO RELATED APPLICATIONS

This application is based upon and claims the benefit of priority from Japanese Patent Application No. 2013-062590, filed Mar. 25, 2013, the entire contents of which are incorporated herein by reference.

FIELD

Embodiments described herein relate generally to a semiconductor device and a method of manufacturing the same.

BACKGROUND

As semiconductor devices are refined more highly, their metal interconnect decreases in its width and height. This causes a problem that the interconnect width and height get closer to the mean free path of conduction electrons and an interface inelastic scattering effect increases electrical resistivity. In particular, if the interconnect width and height are almost equal to or not greater than the mean free path, the interface inelastic scattering effect increases electrical resistivity more greatly. To prevent the electrical resistivity from increasing, it is proposed to use graphene interconnect that is less influenced by the interface inelastic scattering effect.

However, when the interconnect length is shorter than the ballistic conduction length, the resistance of the graphene interconnect is higher than that of the metal interconnect. It is thus inexpedient to use graphene interconnect for all the interconnect.

Therefore, a structure and a method capable of forming low-resistance interconnect even though the interconnect width and height are decreased, is desired.

It is considered that graphene is formed by supplying carbon to the facet of an underlying layer. Since, however, the location or shape of the facet is not sufficiently controlled, there is a problem that a good-quality, uniform graphene layer is not formed.

Therefore, a structure and a method capable of forming a good-quality, uniform graphene layer have been desired.

BRIEF DESCRIPTION OF THE DRAWINGS

FIGS. 1 to 10 are sectional views, each showing one step of a method of manufacturing a semiconductor device of a first embodiment;

FIG. 11 is a sectional view showing a structure of a semiconductor device of a second embodiment;

FIGS. 11A, 11B and 12 are sectional views, each showing a structure of a semiconductor device of a modification to the second embodiment;

FIG. 15 is a sectional view showing a structure of a semiconductor device of a fourth embodiment;

FIG. 16 is a sectional view showing a structure of a semiconductor device of a modification to the fourth embodiment;

FIG. 17 is a sectional view showing a structure of a semiconductor device of a fifth embodiment;

FIG. 18 is a sectional view showing a structure of a semiconductor device of a sixth embodiment; and FIG. 19 is a sectional view showing a structure of a semiconductor device of a seventh embodiment.

DETAILED DESCRIPTION

Figure 7:
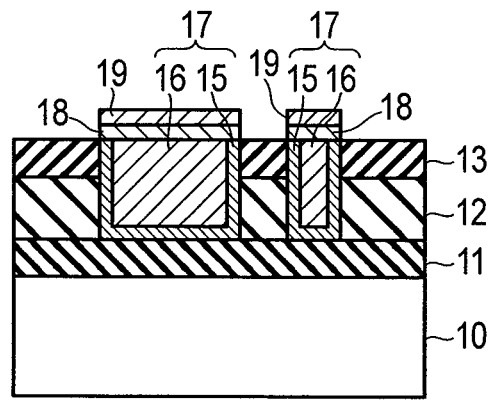

In general, according to one embodiment, a semiconductor device comprises: a metal interconnect and a graphene interconnect which are stacked to one another.

Embodiments will be described below with reference to the accompanying drawings.

First Embodiment

FIGS. 1-10 are sectional views each schematically showing a method for manufacturing a semiconductor device according to a first embodiment.

Referring first to FIG. 1, a stacked film is formed on an underlying region 10 including a semiconductor substrate (not shown) and a semiconductor element (not shown) such as a transistor. The stacked film includes insulation films 11, 12 and 13 and serves as an insulation region. For example, a silicon nitride film, a silicon oxide film and a silicon nitride film can be used as the insulation film 11, insulation film 12 and insulation film 13, respectively.

Referring next to FIG. 2, a trench 14 is formed in the insulation films 12 and 13 by photolithography, reactive ion etching (RIE), etc.

Referring next to FIG. 3, a barrier metal film 15 is formed on the entire surface of the trench 14 including the side and bottom surfaces thereof. For the barrier metal film 15, for example, a Ti film, a Ta film, a TiN film or a TaN film is used.

Referring next to FIG. 4, a copper seed layer is formed on the barrier metal film 15 and a copper plating film is formed on the copper seed layer through a plating process. Accordingly, the trench 14 is filled with a copper film 16. After that, heat treatment for increasing the particle diameter of copper is carried out in order to prevent variations due to a temporal change in film quality which is made by self-aging or the like.

Referring next to FIG. 5, the barrier metal film 15 and copper film 16 are planarized by chemical mechanical polishing (CMP). Accordingly, metal interconnect 17 including the barrier metal film 15 and copper film 16 is formed on or above the underlying region 10.

Referring next to FIG. 6, catalyst treatment is carried out. More specifically, first, palladium (Pd) is selectively formed on the metal interconnect 17 as a pre-catalyst (not shown) for electroless plating. After that, a catalyst layer 18 is selectively formed through an electroless plating process on the metal interconnect 17 to which pre-catalyst treatment is applied. The catalyst layer 18 serves as a cap metal layer. The thickness of the catalyst layer 18 is about 1 nm through 20 nm. For the catalyst layer 18, a film (CoWP, CoWB, etc.) including cobalt (Co) as the principal ingredient is used. In general, for the catalyst layer 18, a film including at least one of Co, Ni and Fe as the principal ingredient can be used.

Referring next to FIG. 7, the catalyst layer 18 is caused to serve as a catalyst and a graphene layer 19 is selectively formed on the catalyst layer 18. In this specification, single-layered graphene and multilayered graphene are both referred to as graphene. In the first embodiment, multilayered graphene is used as the graphene layer 19. The graphene layer 19 is formed by chemical vapor deposition (CVD), for example. Hydrocarbon-based gas (methane, acetylene, etc.) or mixed gas containing the hydrocarbon-based gas is used as a carbon source of CVD. Hydrogen gas or noble gas is used as carrier gas. Favorably, the temperature at which the graphene layer 19 is formed falls within a range from 200° C. to 1000° C. More favorably, the temperature falls within a range from 500° C. to 600° C. In order to eliminate ions and electrons using remote plasma, an electrode can be provided above a substrate to be treated in order to apply a voltage. Favorably, the voltage applied to form the graphene layer 19 is 0 to about ±100V. As a result, the graphene layer 19 is selectively formed on the catalyst layer 18, and stacked interconnect including the metal interconnect 17 and graphene interconnect 19 is formed.

Figure 8:
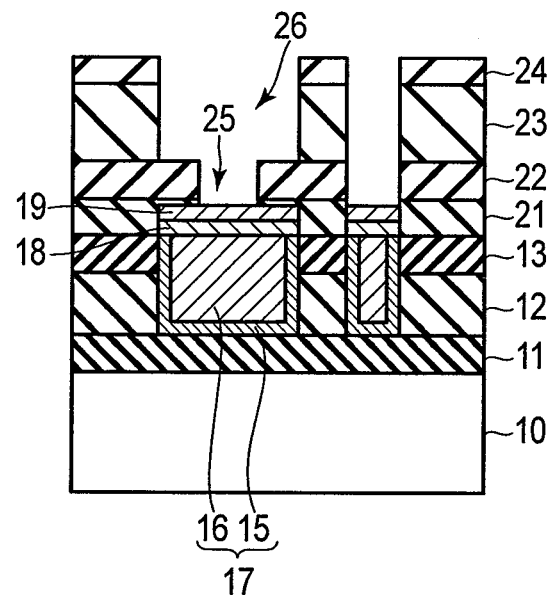

Referring next to FIG. 8, insulation films 21, 22, 23 and 24 are formed. Then, a via hole 25 and a trench 26 are formed in the insulation films 21, 22, 23 and 24 by photolithography, RIE, etc.

Figure 9:
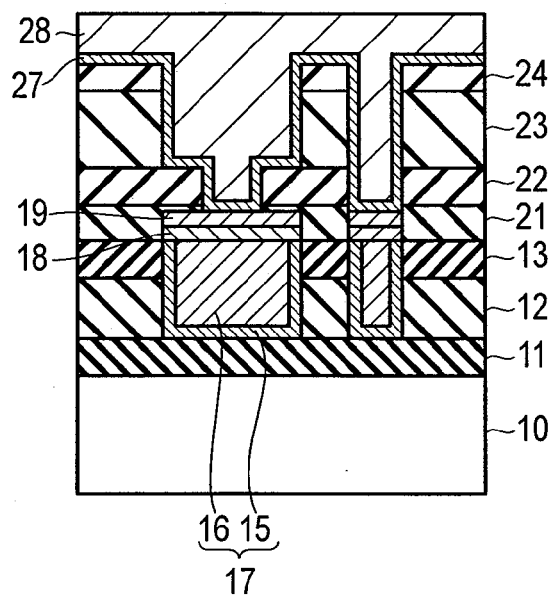

Referring next to FIG. 9, a barrier metal film 27 is formed on the entire surfaces of the via hole 25 and trench 26 which include the side and bottom surfaces thereof. For the barrier metal film 27, for example, a Ti film, a Ta film, a TiN film or a TaN film is used. Moreover, a copper film 28 is formed on the barrier metal film 27. Accordingly, the via hole 25 and trench 26 are filled with the copper film 28. After that, heat treatment for increasing the particle diameter of copper is carried out in order to prevent variations due to a temporal change in film quality which is made by self-aging or the like.

Figure 10:
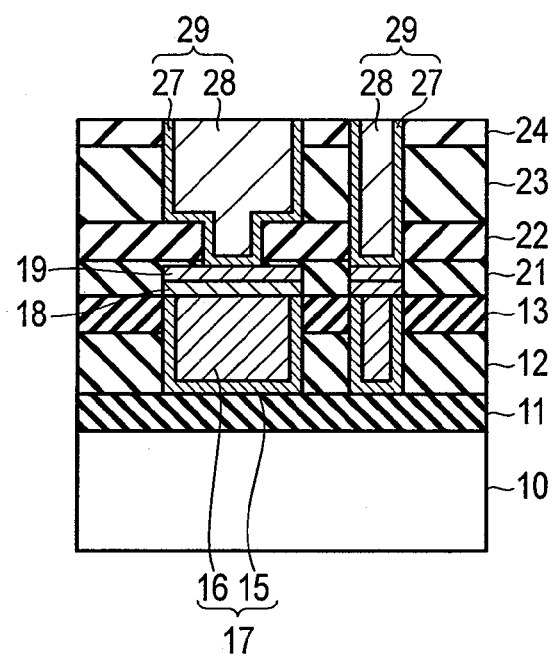

Referring next to FIG. 10, the barrier metal film 27 and copper film 28 are planarized by CMP. Accordingly, metal interconnect 29 having a dual damascene structure including the barrier metal film 27 and copper film 28 is formed. The metal interconnect 29 is electrically connected to both the metal interconnect 17 and graphene interconnect 19.

Through the above process, a semiconductor device as shown in FIG. 10 is obtained. More specifically, a semiconductor device having stacked interconnect including the metal interconnect 17 and graphene interconnect 19 which are stacked and formed on or above the underlying region 10, is obtained. In the first embodiment, the graphene interconnect 19 is formed on the metal interconnect 17, and the catalyst layer 18, which serves as a catalyst to form the graphene interconnect 19, is formed between the metal interconnect 17 and graphene layer 19.

As has been described, there is a problem that as the interconnect width and height of the metal interconnect get closer to the mean free path of conduction electrons, an interface inelastic scattering effect increases electrical resistivity. For example, in copper (Cu) used for copper interconnect, the mean free path of conduction electrons is about 40 nm. In graphene, the mean free path of conduction electrons is about 100 nm to 1 µm, which allows low-resistance interconnect using quantization conduction. However, in interconnect whose length is shorter than the ballistic conduction length, the resistance of the graphene interconnect is higher than that of the metal interconnect. In interconnect whose width and height are great, the metal interconnect is more advantageous. It is thus inexpedient to use graphene interconnect for all the interconnect. Furthermore, it is difficult in design terms to use metal interconnect and graphene interconnect properly according to interconnect length, interconnect width and interconnect height.

As described above, in the semiconductor device according to the first embodiment, the interconnect is formed by stacked interconnect including the metal interconnect 17 and graphene interconnect 19. In other words, substantially the entire part of the interconnect is a stacked structure of the metal interconnect 17 and graphene interconnect 19. For this reason, the metal interconnect is used chiefly as a current path on a priority basis in an interconnect portion whose length is less than the ballistic conduction length of graphene interconnect, and the graphene interconnect is used chiefly as a current path on a priority basis in an interconnect portion whose length is greater than the ballistic conduction length of graphene interconnect. In an interconnect portion whose interconnect width and interconnect height are greater, the metal interconnect is used as a current path on a priority basis. In the first embodiment, therefore, low-resistance interconnect can be achieved in substantially all the interconnect portions without making it difficult in design terms to use metal interconnect and graphene interconnect properly.

In the semiconductor device according to the first embodiment, the catalyst layer 18 is selectively formed on the metal interconnect 17 and graphene interconnect 19 is selectively formed on the catalyst layer 18. Accordingly, the graphene interconnect 19 can be aligned with the metal interconnect 17. It is thus possible to form the stacked interconnect of the metal interconnect 17 and graphene interconnect 19 easily and reliably.

In the foregoing embodiment, a plug connected to the graphene interconnect 19 can be formed as follows. For example, after contact metal (Ti, Ta, Hf, etc.) is formed, barrier metal (e.g., TiN) can be formed and then a tungsten (W) plug can be formed through CVD-W process.

In the foregoing embodiment, a selective CVD process can be employed to form the catalyst layer 18 on the metal interconnect 17 selectively.

In the foregoing embodiment, the number of graphene layers to form the graphene interconnect (multilayered graphene interconnect) can be determined as follows. For example, the number of graphene layers to form graphene interconnect can be determined such that the resistance of graphene interconnect having a length similar to the ballistic length of the graphene interconnect and that of metal interconnect having a length similar to the ballistic length of the graphene interconnect become equal to each other. This facilitates resistivity design.

In the foregoing embodiment, the catalyst layer is formed on the Cu damascene interconnect. However, as the interconnect becomes fine, metal materials whose mean free path is short, such as W, Mo and Ru may be used as interconnect materials. The catalyst layer and graphene interconnect can be formed on the interconnect using these metal materials. If the interconnect materials are changed, the processing method may also be changed. For example, in order to form interconnect by RIE, a catalyst layer can be stacked on a metal interconnect material layer and then the catalyst layer and the metal interconnect material layer can be shaped into interconnect at once. Similarly, in order to form interconnect by RIE, a metal interconnect material layer can be shaped into interconnect and then a catalyst layer can be formed to cover the layer shaped into interconnect.

Second Embodiment

FIG. 11 is a sectional view schematically showing a structure of a semiconductor device according to a second embodiment. The structure of the semiconductor device according to the second embodiment is basically similar to that of the semiconductor device according to the first embodiment. Thus, the structural elements corresponding to those of the first embodiment are denoted by the same reference numerals and their detailed descriptions are omitted in the second embodiment.

In the second embodiment, after the metal interconnect 17 is formed in the step shown in FIG. 5 of the first embodiment, the surface of the copper interconnect (copper film) 16 is oxidized using a chemical solution containing an oxidizing agent. If, moreover, an oxide film is removed from the surface of the copper interconnect 16, the top surface of the copper interconnect is depressed. After that, catalyst treatment is carried out to form a catalyst layer (cap metal layer) 18, as in the step shown in FIG. 6 of the first embodiment. At this time, the top surface of the catalyst layer 18 is set lower than that of its surrounding insulation film 13. Furthermore, a graphene layer 19 is selectively formed on the catalyst layer 18, as in the step shown in FIG. 7 of the first embodiment. Then, for example, an interlayer insulation film 31 and a plug 32 are formed.

In general, graphene is easy to grow from an edge such as a corner of a trench. In the second embodiment, a process of depressing the top surface of the copper interconnect 16 is performed and thus the top surface of the catalyst layer 18 formed on the copper interconnect 16 can be made lower than that of its surrounding insulation film 13. As a result, graphene of good quality can easily be grown from the corner (edge) of a trench which is a starting point.

FIG. 12 is a sectional view schematically showing a structure of a semiconductor device according to a modification to the second embodiment. In this modification, when the top surface of the copper interconnect 16 is depressed, the top surface of the barrier metal film 15 is also depressed. In this case, too, graphene of good quality can easily be grown from the corner of a trench which is a starting point.

Third Embodiment

Figure 13:
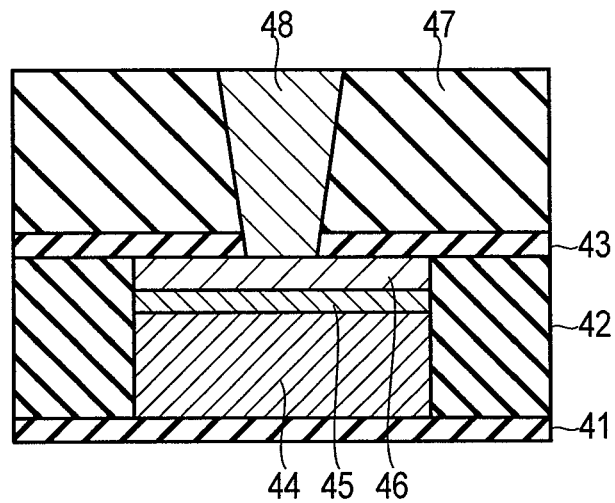
FIG. 13 is a sectional view showing a structure of a semiconductor device of a third embodiment.

FIG. 13 is a sectional view schematically showing a structure of a semiconductor device according to a third embodiment. The detailed description of the same matter as that of the first embodiment is omitted.

In the first embodiment, the copper interconnect 16 is formed through the damascene process. Instead of the copper interconnect 16, tungsten (W) interconnect, molybdenum (Mo) interconnect or ruthenium (Ru) interconnect can be formed through the RIE process. In particular, as the interconnect becomes fine, these metal materials whose mean free path is short are very likely to be used to prevent an increase in resistance due to the narrow line effect. More specifically, a W layer (or a Mo layer and a Ru layer) is formed on an insulation film 41 as a metal interconnect material layer 44 and then a catalyst layer (a cap metal layer) 45 is formed on the metal interconnect material layer 44. For control of catalyst orientation, a catalyst orientation control layer (a promoter layer) can be formed on the metal interconnect material layer 44 and then the catalyst layer 45 can be formed. After the metal interconnect material layer and the others are processed to form interconnect 44, a graphene layer (graphene interconnect) 46 is formed. After that, insulation films 42, 43 and 47 are formed and a plug 48 is formed, with the result that a structure as shown in FIG. 13 can be obtained.

As described above, instead of the interconnect (damascene interconnect) formed through the damascene process, interconnect (RIE interconnect) can be formed through the RIE process and graphene interconnect 46 can be formed on the RIE interconnect. In this case, too, the same advantage as that of the first embodiment can be brought about.

In the example of FIG. 13, the catalyst layer 45 is formed on the metal interconnect material layer 44 and these layers 44 and 45 are processed by RIE, and then the graphene interconnect 46 is formed on the RIE interconnect. However, the catalyst layer 45 and graphene layer 46 can be formed on the metal interconnect material layer 44 and then these layers 44, 45 and 46 can be processed to form interconnect.

Figure 14:
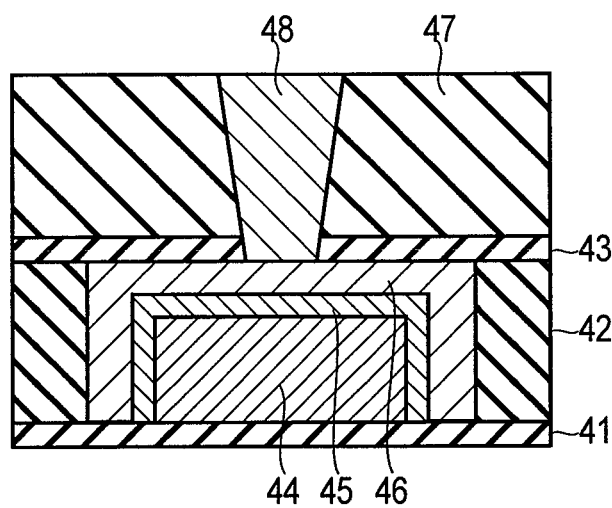
FIG. 14 is a sectional view showing a structure of a semiconductor device of a modification to the third embodiment.

FIG. 14 shows a modification to the semiconductor device according to the third embodiment. In this modification, the metal interconnect material layer 44 is processed by RIE to form metal interconnect and then a hard mask is removed. After that, a catalyst orientation control layer (a promoter layer) is formed on the surface of the metal interconnect 14, and the catalyst layer 45 and graphene layer 46 are formed in sequence. Since, in this case, the catalyst orientation control layer and the catalyst layer 45 are formed on the side of the metal interconnect 44, the graphene interconnect 46 is also formed on the side of the metal interconnect 44.

The catalyst layer can be formed on the catalyst orientation control layer or directly formed on the metal interconnect.

In the foregoing first to third embodiments, the top surface of the graphene interconnect is brought into contact with the plug. However, the plug can be formed to penetrate the graphene interconnect or penetrate the graphene interconnect and the catalyst layer. In these cases, the graphene interconnect and the plug are connected to each other on the side of a through hole formed in the graphene interconnect. For example, FIG. 11A shows an example in which the plug 32 is formed so as to penetrate the graphene interconnect 19 and FIG. 11B shows an example in which the plug 32 is formed so as to penetrate the graphene interconnect 19 and the catalyst layer 18.

Fourth Embodiment

FIG. 15 is a sectional view schematically showing a structure of a semiconductor device according to a fourth embodiment. The detailed description of the same matter as that of the first embodiment is omitted.

In the first embodiment, the graphene interconnect is formed on the metal interconnect. In the fourth embodiment, however, the metal interconnect is formed on the graphene interconnect. More specifically, a barrier metal film 54, a catalyst layer 55, a graphene layer 56 and a metal film 57 are formed in sequence on an insulation film 51. After that, the barrier metal film 54, catalyst layer 55, graphene layer 56 and metal film 57 are patterned by photolithography and RIE to form stacked interconnect including graphene interconnect 56 and metal interconnect 57. Insulation films 52, 53 and 58 are formed and then a plug 59 is formed, with the result that a structure as shown in FIG. 15 can be obtained. The barrier metal film 54 serves as a promoter layer for controlling the orientation of the catalyst layer 55.

If the metal interconnect 57 is formed on the graphene interconnect 56 to form stacked interconnect, low-resistance interconnect can be achieved in substantially all the interconnect portions without making it difficult in design terms to use metal interconnect and graphene interconnect properly, as in the first embodiment.

After the barrier metal film 54 and the catalyst layer 55 are formed in an interconnect pattern form, the graphene interconnect 56 can selectively be formed on the catalyst layer 55 and then the metal interconnect 57 can be formed by RIE.

FIG. 16 is a sectional view schematically showing a structure of a semiconductor device according to a modification to the fourth embodiment. In this modification, a contact layer 50 is provided between the graphene interconnect 56 and the metal interconnect 57. For example, titanium (Ti) can be used for the contact layer 50. A semiconductor device including such a contact layer can be adopted.

In the foregoing first to fourth embodiments, the plug connected to the stacked interconnect of the metal interconnect and the graphene interconnect can be made of metal or carbon nanotube (CNT).

Fifth Embodiment

FIG. 17 is a sectional view schematically showing a structure of a semiconductor device according to a fifth embodiment. The semiconductor device with the structure shown in FIG. 17 is manufactured as described below.

First, an insulation film 61 is formed on an underlying region 60 including a semiconductor substrate (not shown) and a semiconductor element (not shown) such as a transistor, and an insulation film 62 is formed on the insulation film 61. The insulation films 61 and 62 serve as an insulation region. As the insulation film 62, a silicon oxide film is used and, more specifically, a TEOS oxide film is used. Then, a hole is formed in the insulation films 61 and 62 and a plug 63 is formed in this hole. The plug 63 is made of metal material such as W, Cu and Al. Barrier metal can be formed on the inner surface of the hole. As the material of the barrier metal, Ta, Ti, Ru, Mn, Co or nitride of these metals can be used.

Next, the insulation film 62 is recessed by RIE and accordingly it has an inclined surface around the exposed portion of the plug 63 (the top of the plug 63). More specifically, the insulation film 62 remains on the side wall of the top portion of the plug 63 and an inclined surface is formed on the remaining insulation film 62. The angle of the inclined surface is set to about 30 to 60 degrees with respect to the horizontal plane. The depth of the recessed insulation film 62 is set to about 1 to 50 nm.

Next, a Ti/TiN film having a thickness of about 1 to 20 nm is formed as a barrier metal film 64 on the recessed insulation film 62 and on the exposed portion of the plug 63 (the top of the plug 63) by PVD. In general, Ti, Ta, Mn, Ru, Ir, Cu, Zn, an alloy containing these metals, or nitride of these metals can be used for the barrier metal film 64. The barrier metal film 64 can be formed by CVD as well as PVD. Further, the barrier metal film 64 serves as a promoter layer for controlling the orientation of a catalyst layer 65 described later.

Next, a Ni film having a thickness of about 1 to 50 nm is formed as the catalyst layer 65 on the barrier metal film 64 by PVD or CVD. A film containing at least one of Co, Ni and Fe as the principal ingredient can be used as the catalyst layer 65. Since the insulation film 62 has an inclined surface, its corresponding inclined surface of the catalyst layer 65 serves as a facet.

Next, a graphene layer 66 is formed on the catalyst layer 65. The graphene layer 66 is formed by CVD, for example. Hydrocarbon-based gas (methane, acetylene, etc.) or mixed gas containing the hydrocarbon-based gas is used as a carbon source of the CVD. Hydrogen gas or noble gas is used as carrier gas. Favorably, the temperature at which the graphene layer 66 is formed falls within a range from 200° C. to 1000° C. More favorably, the temperature falls within a range from 500° C. to 600° C. In order to eliminate ions and electrons using remote plasma, an electrode can be provided above a substrate to be treated in order to apply a voltage. Favorably, the voltage applied to form the graphene layer 66 is 0 to about ±100V.

The graphene layer 66 grows from the facet of the catalyst layer 65 formed to correspond to the inclined surface of the insulation film 62. Thus, a good-quality, uniform graphene layer 66 can be achieved. The catalyst layer 65 and graphene layer 66 are oriented toward (111) face of the face-centered structure or (002) face of the hexagonal close-packed structure. Accordingly, the graphene layer 66 is formed on the insulation film 62 and the exposed portion of the plug 63 with the barrier metal film 64 and catalyst layer 65 interposed between them.

Furthermore, the graphene layer 66 is patterned by photolithography and RIE to form graphene interconnect 66.

As described above, in the fifth embodiment, the insulation film 62 has an inclined surface around the exposed portion of the plug 63. Thus, the good-quality, uniform graphene layer 66 can be grown from the facet of the catalyst layer 65 formed to correspond to the inclined surface. Using the graphene layer 66 so formed, graphene interconnect of good quality can be obtained.

Sixth Embodiment

FIG. 18 is a sectional view schematically showing a structure of a semiconductor device according to a sixth embodiment. The structure of the semiconductor device according to the sixth embodiment is basically similar to that of the semiconductor device according to the fifth embodiment. Thus, the structural elements corresponding to those of the fifth embodiment are denoted by the same reference numerals and their detailed descriptions are omitted in the sixth embodiment.

In the fifth embodiment, the horizontal plane of the insulation film 62 is lower than the top surface of the plug 63. In the sixth embodiment, however, the horizontal plane of an insulation film 62 is higher than the top surface of a plug 63 and, in this case, too, the insulation film 62 has an inclined surface around the exposed portion (top surface) of the plug 63. The angle of the inclined surface is set to about 30 to 60 degrees with respect to the horizontal plane. A graphene layer 66 grows from the facet of a catalyst layer 65 formed to correspond to the inclined surface of the insulation film 62.

In the sixth embodiment, too, the insulation film 62 has an inclined surface. Therefore, as in the fifth embodiment, a good-quality, uniform graphene layer 66 can be formed to grow from the facet of the catalyst layer 65, with the result that good-quality graphene interconnect can be obtained.

Seventh Embodiment

FIG. 19 is a sectional view schematically showing a structure of a semiconductor device according to a seventh embodiment. The structure of the semiconductor device according to the seventh embodiment is basically similar to that of the semiconductor device according to the fifth embodiment. Thus, the structural elements corresponding to those of the fifth embodiment are denoted by the same reference numerals and their detailed descriptions are omitted in the seventh embodiment.

In the seventh embodiment, a plug 63 is formed as in the fifth embodiment and then a conductive structure 67 having a slanted surface is formed selective on the plug 63 by selective CVD or electroless plating. The conductive structure 67 can be made of metal or metal nitride. More specifically, the conductive structure 67 can be made of TiN, Ru, TaN, RuN, Co, CoN, Ni, NiN, W, Cu, CoW or the like. The thickness (height) of the conductive structure 67 is about 1 to 30 nm. The angle of the inclined surface of the conductive structure 67 is about 30 to 60 degrees with respect to the horizontal plane.

After that, as in the fifth embodiment, a barrier metal film 64, a catalyst layer 65 and a graphene layer 66 are formed. In order to correspond to the inclined surface of the conductive structure 67, the inclined surface of the catalyst layer 65 serves as a facet. The graphene layer 66 grows from the facet of the catalyst layer 65.

In the seventh embodiment, the conductive structure 67 has an inclined surface. Therefore, as in the fifth embodiment, a good-quality, uniform graphene layer 66 can be formed to grow from the facet of the catalyst layer 65, with the result that good-quality graphene interconnect can be obtained.

Furthermore, in the seventh embodiment, the conductive structure 67 is formed and then the barrier metal film 64, catalyst layer 65 and graphene 66 are formed. If, however, the conductive structure 67 is made of barrier metal materials, the barrier metal film 64 need not be formed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a plug;
a metal interconnect;
a graphene interconnect; and
an insulation region,
wherein
the plug is formed in the insulation region, electrically connected to the metal interconnect, and has a top surface and a bottom surface parallel with each other, and side surfaces between the top surface and the bottom surface,
the metal interconnect includes a main body portion and a barrier metal portion provided on a bottom surface and side surfaces of the main body portion, a top surface of the main body portion being located lower than a top surface of the barrier metal portion,
the graphene interconnect is formed on the top surface of the main body portion, on the insulation region and on portions of the side surfaces of the plug, and
the insulation region has an inclined surface around the plug.

2. The device of claim 1, further comprising:
a catalyst layer serving as a catalyst when the graphene interconnect is formed on the top surface of the main body portion of the metal interconnect, the catalyst layer being provided between the top surface of the main body portion of the metal interconnect and the graphene interconnect.

3. The device of claim 2, wherein the catalyst layer includes at least one of cobalt (Co), nickel (Ni) and iron (Fe) as a principal ingredient.

4. The device of claim 1, wherein the metal interconnect includes one of a copper (Cu) interconnect, a tungsten (W) interconnect, and an aluminum (Al) interconnect.

5. The device of claim 1, wherein the graphene interconnect is a multilayered graphene interconnect.

* * * * *